United States Patent [19]

Sanzo et al.

[11] Patent Number: 5,896,058

[45] Date of Patent: Apr. 20, 1999

[54] HIGH SPEED TOTEM POLE FET DRIVER CIRCUIT WITH DIFFERENTIAL CROSS CONDUCTION PREVENTION

[75] Inventors: Christopher John Sanzo, Providence; Jeffrey Gordon Dumas, West Warwick; Stephen Saunders Yole, North Kingstown, all of R.I.

[73] Assignee: Cherry Semiconductor Corporation, East Greenwich, R.I.

[21] Appl. No.: 08/829,004

[22] Filed: Mar. 31, 1997

[51] Int. Cl.⁶ .................................................. H03K 17/60
[52] U.S. Cl. .......................... 327/432; 327/65; 327/111; 327/112
[58] Field of Search ...................... 326/82, 89; 327/60, 327/63, 65, 68, 69, 72, 77, 108, 109, 110, 111, 112, 374, 379, 411, 412, 432

[56] References Cited

U.S. PATENT DOCUMENTS

| | | | |
|---|---|---|---|
| 4,684,824 | 8/1987 | Moberg | 307/270 |
| 4,849,651 | 7/1989 | Estes | 307/125 |
| 5,023,481 | 6/1991 | Tero et al. | 307/456 |
| 5,281,862 | 1/1994 | Ma | 307/270 |
| 5,291,382 | 3/1994 | Cohen | 363/16 |
| 5,325,258 | 6/1994 | Choi et al. | 361/87 |
| 5,365,118 | 11/1994 | Wilcox | 327/109 |
| 5,408,150 | 4/1995 | Wilcox | 327/108 |
| 5,502,610 | 3/1996 | Chaney | 361/18 |
| 5,508,906 | 4/1996 | Nelli et al. | 363/97 |
| 5,519,357 | 5/1996 | Eddlemon | 330/264 |
| 5,757,210 | 5/1998 | Sanzo | 327/63 |
| 5,781,058 | 7/1998 | Sanzo et al. | 327/387 |

*Primary Examiner*—Timothy P. Callahan
*Assistant Examiner*—Jeffrey Zweizig
*Attorney, Agent, or Firm*—Bromberg & Sunstein LLP

[57] ABSTRACT

A high speed totem pole FET driver circuit with differential cross-conduction prevention. The driver circuit includes first and second switching elements coupled to a first node, and third and fourth switching elements coupled to a second node. The first node is coupled to a first current source, a pulldown circuit, and the input of the third switching element. The second node is coupled to a second current source, a pullup circuit, and the input of the second switching element. Trigger inputs are applied to the inputs of the first and fourth switching elements to switch the first and fourth switches ON and OFF, wherein the two trigger inputs are of opposite phase so that when one input is HIGH (LOW) the other input is LOW (HIGH). The second switching element may include a comparator circuit with its non-inverting input coupled to the second node, its inverting input coupled to a power source via a $V_{BE}$ circuit, and its output coupled to a fifth switching element, where the fifth switching element is coupled to the first node.

18 Claims, 2 Drawing Sheets

5,896,058

1

HIGH SPEED TOTEM POLE FET DRIVER CIRCUIT WITH DIFFERENTIAL CROSS CONDUCTION PREVENTION

FIELD OF THE INVENTION

This invention relates to a driver circuit for driving a field-effect transistor, and in particular to a driver circuit with a totem pole output in which cross conduction is prevented.

BACKGROUND OF THE INVENTION

It is often necessary to switch a field-effect transistor (FET) ON and OFF at high speeds with a driver circuit. It is common for such driver circuits to have a totem pole output which includes a "source" transistor for sourcing current to the gate of the FET and a "sink" transistor for removing charge from the gate of the FET. The source and sink transistors may respectively be considered to be part of active pullup and pulldown circuits.

It is undesirable for both pullup and pulldown circuits to be ON simultaneously (the cross-conduction condition), for then a relatively large current will flow from the power supply, through the pullup and pulldown circuits, and to ground, thereby wasting energy and causing unwanted heating. Therefore, if the driver circuit has already switched ON the FET in which the pullup circuit is ON and the pulldown circuit is OFF, then when switching OFF the FET it is desirable that the pullup circuit be switched OFF before the pulldown circuit is switched ON. Similarly, if the driver circuit has already switched OFF the FET in which the pulldown circuit is ON and the pullup circuit is OFF, then when switching ON the FET it is desirable for the pulldown circuit be switched OFF before the pullup circuit is switched ON.

SUMMARY OF THE INVENTION

It is an aspect of the present invention for a driver circuit with a totem pole output circuit to switch an FET ON and OFF without incurring cross-conduction in the totem pole output circuit.

It is another aspect of the present invention to prevent cross-conduction in an integrated driver circuit in a reliable way.

An embodiment of the present invention includes first and second switching elements coupled to a first node, and third and fourth switching elements coupled to a second node. The first node is coupled to a first current source, a pulldown circuit, and an input to the third switching element. The second node is coupled to a second current source, a pullup circuit, and an input to the second switching element. When both first and second switching elements are OFF, the first node is brought to a HIGH voltage, which switches ON the pulldown circuit. When both third and fourth switching elements are OFF, the second node is brought to a HIGH voltage, which switches ON the pullup circuit. When at least one of the first and second switching elements is ON, the first node is brought to a LOW voltage, which switches OFF the pulldown circuit. When at least one of the third and fourth switching elements is ON, the second node is brought to a LOW voltage, which switches OFF the pullup circuit. Trigger inputs are applied to the inputs of the first and fourth switching elements to switch the first and fourth switches ON and OFF, wherein the two trigger inputs are of opposite phase so that when one input is HIGH (LOW) the other input is LOW (HIGH). The driver switches the FET ON and OFF

2 when the trigger inputs change state. The combination of switching elements prevents cross-conduction. A preferred embodiment of the present invention further includes a comparator circuit with its non-inverting input coupled to the second node, its inverting input coupled to a power source via a $V_{BE}$ circuit, and its output coupled to the second switching element.

DETAILED DESCRIPTION OF THE EMBODIMENTS

Figure 1:
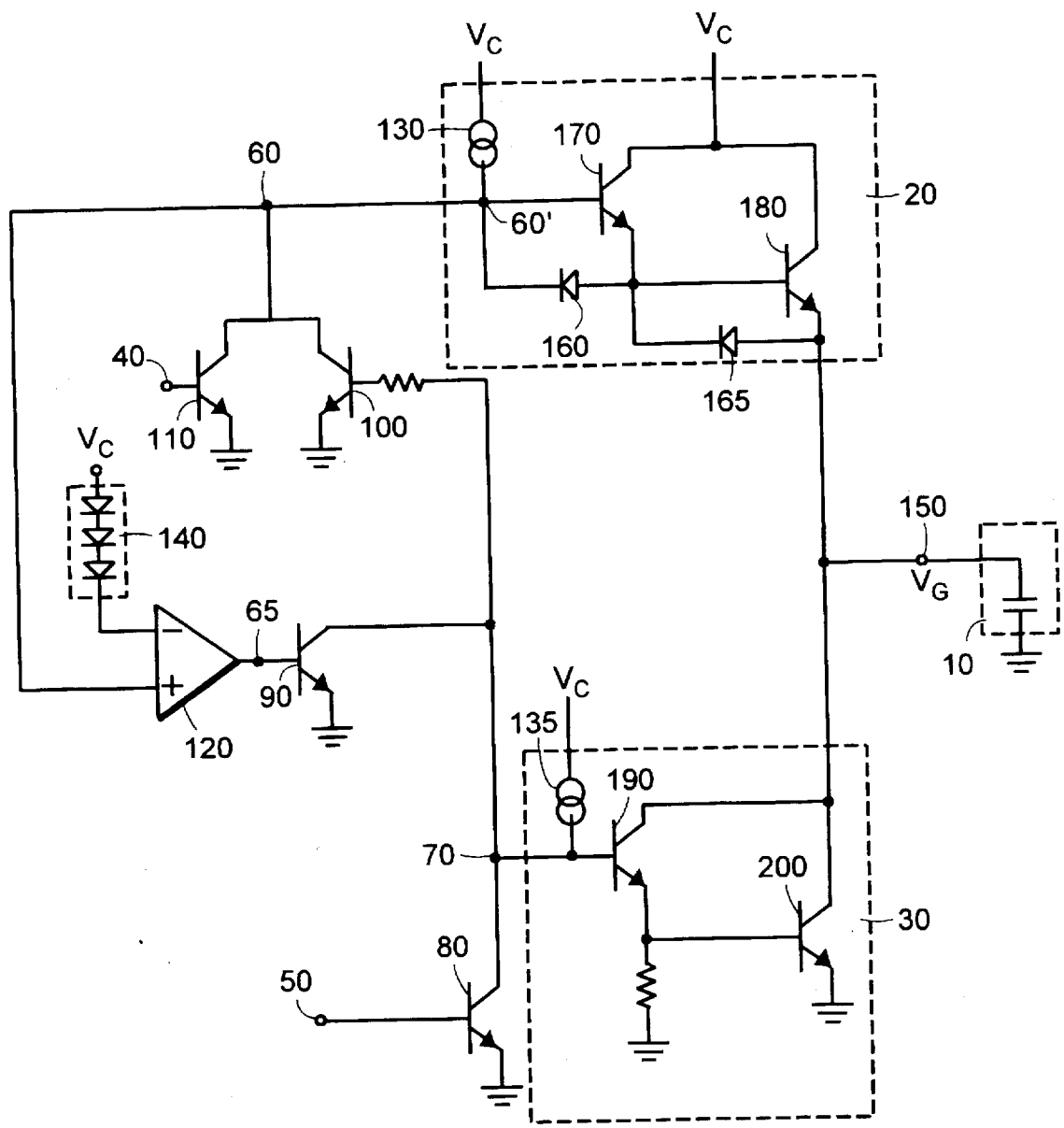
FIG. 1 is a high level schematic of an embodiment of the present invention.

The embodiment of FIG. 1 provides for the charging and discharging of capacitive load 10 by alternatively switching ON and OFF pullup circuit 20 and pulldown circuit 30 in response to input signals at inputs 40 and 50. The input signals at inputs 40 and 50 are synchronous and of opposite phase, so that inputs 40 and 50 are respectively HIGH and LOW or LOW and HIGH. These input signals may be generated by the two complementary outputs of a flip-flop (not shown).

Transistors 80, 90, 100, and 110 serve as switching elements. The collectors of transistors 80 and 90 are coupled to node 70, which is coupled to current source 135 and to the base of transistor 190. When transistor 80 is ON or when transistor 90 is ON (or when both are ON), current is shunted from current source 135 to ground and the voltage at node 70 is brought LOW. The LOW voltage at node 70 will be the saturation voltage of either transistor 80 or transistor 90, which is substantially less than $2V_{BE}$, where $V_{BE}$ is the base-emitter forward voltage drop of transistor 190 or transistor 200 (which we assume to be equal to each other). Therefore transistors 190 and 200 will be OFF when the voltage at node 70 is LOW.

When both transistors 80 and 90 are OFF, current source 135 provides current to the base of transistor 190 and the voltage at node 70 rises to $2V_{BE}$ as transistors 190 and 200 begin to conduct. We may denote a voltage of $2V_{BE}$ at node 70 as HIGH, but we note that a HIGH voltage at node 70 will not necessarily have the same numerical value as a HIGH voltage elsewhere in the circuit of FIG. 1. Furthermore, other embodiments may have different values for HIGH and LOW voltages.

Transistors 80 and 90 therefore work in combination as a NOR gate with respect to positive-TRUE logic.

The collectors of transistors 100 and 110 are coupled to node 60, which is coupled to current source 130 and to the base of transistor 170. Although in FIG. 1 it would appear that there is no need to distinguish node 60 from 60', we shall later see in the more detailed schematic of FIG. 2 that in a preferred embodiment of the present invention a buffer circuit will couple node 60' to 60. Thus, for sake of clarity when comparing FIG. 1 to FIG. 2, we have distinguished node 60 from 60', and will continue to do so in the present discussion.

When transistor 100 is ON or when transistor 110 is ON (or when both are ON), current will be shunted from current source 130 to ground and the voltages at nodes 60 and 60' will be brought LOW, which will be the saturation voltage of a bipolar transistor. Provided the voltage at output terminal 150 is not brought below ground, the LOW voltage at node 60' will be insufficient to bring transistors 170 and 180 into conduction. We shall discuss later a preferred embodiment in which the voltage at output terminal 150 is prevented from being brought below ground.

When both transistors 100 and 110 are OFF, current from current source 130 will be provided to the base of transistor 170, which will bring the voltage at node 60' to at least $2V_{BE}$ above the voltage at output terminal 150, where $V_{BE}$ is the base-emitter forward voltage drop of transistor 170 or transistor 180 (which we assume to be equal to each other). Because the voltage at output terminal 150 is at least at ground potential, the voltage at node 60' will rise to at least $2V_{BE}$. Because of pullup circuit 20 and the charging of capacitive load 10, the voltage at node 60' may rise to a voltage close to supply voltage $V_C$. We shall refer to the voltage at node 60' as being HIGH when it is at least $2V_{BE}$. Again, a HIGH voltage at node 60' will not necessarily have the same numerical value as a HIGH voltage elsewhere in the circuit, and may indeed be different for different embodiments.

Transistors 100 and 110 therefore work in combination as a NOR gate with respect to positive-TRUE logic.

The output of comparator circuit 120 is coupled to node 65, which is coupled to the base of transistor 90. Comparator 120 has a non-inverting input coupled to nodes 60 and 60'. We shall see in FIG. 2 that the non-inverting input of comparator 120 is connected directly to node 60'. The inverting input of comparator 120 is connected to a voltage supply (supply a voltage $V_C$) via a "$V_{BE}$" circuit 140, where in a preferred embodiment circuit 140 provides a forward voltage drop equal to three forward-biased diodes.

As will now be explained, the circuit of FIG. 1 prevents the cross-conduction (or "shoot-through") of pullup circuit 20 and pulldown circuit 30 so that current is prevented from being conducted from a supply voltage source to ground via the pullup and pulldown circuits. We shall assume that capacitive load 10, such as the gate of an FET, is connected to terminal 150. The voltage at terminal 150 will be denoted by $V_G$.

In explaining the prevention of cross-conduction, we will assume for simplicity that the switching delays of transistors 80, 90, 100, and 110 are essentially equal to each other, and we denote this delay by δ. We denote the switching delay of comparator 120 by Δ.

First, suppose that the circuit of FIG. 1 is initially in the following state, which we will refer to as state A: $V_G$ is HIGH (which for the specific embodiment of FIG. 1 is to within ($V_{SAT}+V_{BE}$) from the supply voltage $V_C$ but may be different for different embodiments), input 40 is LOW; input 50 is HIGH; pullup circuit 20 is ON, which implies that nodes 60 and 60', the non-inverting input of comparator 120, and node 65 are HIGH; and pulldown circuit 30 is OFF, which implies that node 70 LOW.

With the circuit of FIG. 1 initially in state A, consider a transition at time t=0 at the inputs so that input 40 goes from LOW to HIGH at the same time that input 50 goes from HIGH to LOW. This transition will result in the following: Transistor 110 will switch ON, which will try to bring nodes 60 and 60' and the non-inverting input of comparator 120 LOW. As the voltage at node 60' decreases, pullup circuit 20 will switch OFF, and because $V_G$ is initially HIGH, diodes 160 and 165 will be forward biased and the voltage at the non-inverting input of comparator 120 will be greater than the voltage at the inverting input of comparator 120. Consequently, node 65 will remain HIGH, node 70 will remain LOW, and pulldown circuit 30 will remain OFF.

Thus, we see that pullup circuit 20 is switched OFF before pulldown circuit 30 can switch ON. Capacitive load 10 will discharge to the point where diodes 160 and 165 are no longer forward biased, and nodes 60 and 60' will be brought LOW at t=δ (one transistor delay). With node 60' LOW, pullup circuit 20 will remain OFF.

In order for pullup circuit 20 to remain OFF as the voltage at node 60' is brought toward LOW, the rate of voltage change at the base of transistor 170 must be greater than the rate of voltage change of $V_G$. To facilitate this, a high gain buffer should be located between the collectors of transistors 100 and 110 and the base of transistor 170, i.e., between nodes 60 and 60'. This buffer helps increase the rate of voltage change at the base of transistor 170 and decouples the collector capacitances of transistors 100 and 110 from the base of transistor 170.

Because input 50 has changed from HIGH to LOW, transistor 80 will switch OFF, but this event by itself will not bring node 70 HIGH until transistor 90 has also switched OFF. But transistor 90 is initially ON at time t=0. Because the non-inverting input of comparator 120 goes LOW at time t=δ, node 65 will go LOW at t=δ+Δ, and node 70 will now go HIGH at t=2δ+Δ. Thus, pulldown circuit will begin to switch ON at t=2δ+Δ, and capacitive load 10 will continue to discharge so that $V_G$ will go LOW.

Therefore, we see that cross-conduction does not occur for the input transition just discussed because pullup circuit 20 switches OFF and remains OFF before pulldown circuit 30 is switched ON.

Suppose now that the circuit of FIG. 1 is in the following initial state, which we refer to as state B: $V_G$ is LOW (which for this specific embodiment is within ($V_{SAT}+V_{BE}$) above ground but may be different for different embodiments), input 40 is HIGH; input 50 is LOW; pullup circuit 20 is OFF, which implies that nodes 60 and 60', the non-inverting input of comparator 120, and node 65 are LOW; and pulldown circuit 30 is ON, which implies that node 70 is HIGH. Consider a transition at time t=0 at the inputs so that input 40 goes from HIGH to LOW at the same time that input 50 goes from LOW to HIGH. This transition will result in the following: Transistor 80 will switch ON, which will bring node 70 LOW at t=δ. Consequently, pulldown circuit 30 begins to switch OFF at t=δ. With node 70 LOW at t=δ, transistor 100 will begin to switch OFF, and because transistor 110 has already been switched OFF due to input 40 going LOW at t=0, nodes 60 and 60' will go HIGH at t=2δ. Thus, pullup circuit 20 will begin to switch ON at t=2δ, capacitive load 10 will begin to be charged, and $V_G$ will go HIGH. Node 65 will go high at t=2δ+Δ, switching transistor 90 ON.

Cross-conduction is prevented because pulldown circuit 30 is switched OFF and remains OFF before pullup circuit 30 is switched ON. We also see that the input transition just discussed will bring the circuit of FIG. 1 back to initial state A. Similarly, we see that the input transition previously discussed will bring the circuit of FIG. 1 from state A to state B.

As discussed earlier, a high gain buffer should be located between nodes 60 and 60'. This high gain buffer also plays a role during the transition from state B to A in which pullup circuit 30 is switched ON by providing a high rate of voltage change at node 60', or equivalently, the base of transistor 170. Without a buffer circuit, the highest voltage obtained at gate terminal 150 will be the so-called DC saturation level, which for the embodiment of FIG. 1 is $V_C-V_{SAT}-V_{BE}$. However, with a buffer circuit causing a high rate of change of voltage at node 60', there is a large change of current density in transistor 180, thereby causing an inductance-type effect in which the voltage at gate terminal 150 is larger than the DC saturation voltage. This is desirable if gate terminal 150 is to drive a pFET so that the pFET is quickly switched OFF.

It should be emphasized that in the embodiment of FIG. 1, transistors 80, 90, 100, 110, and comparator 120 provide switching functions, and other types of switching elements may be substituted for these components.

Figure 2:
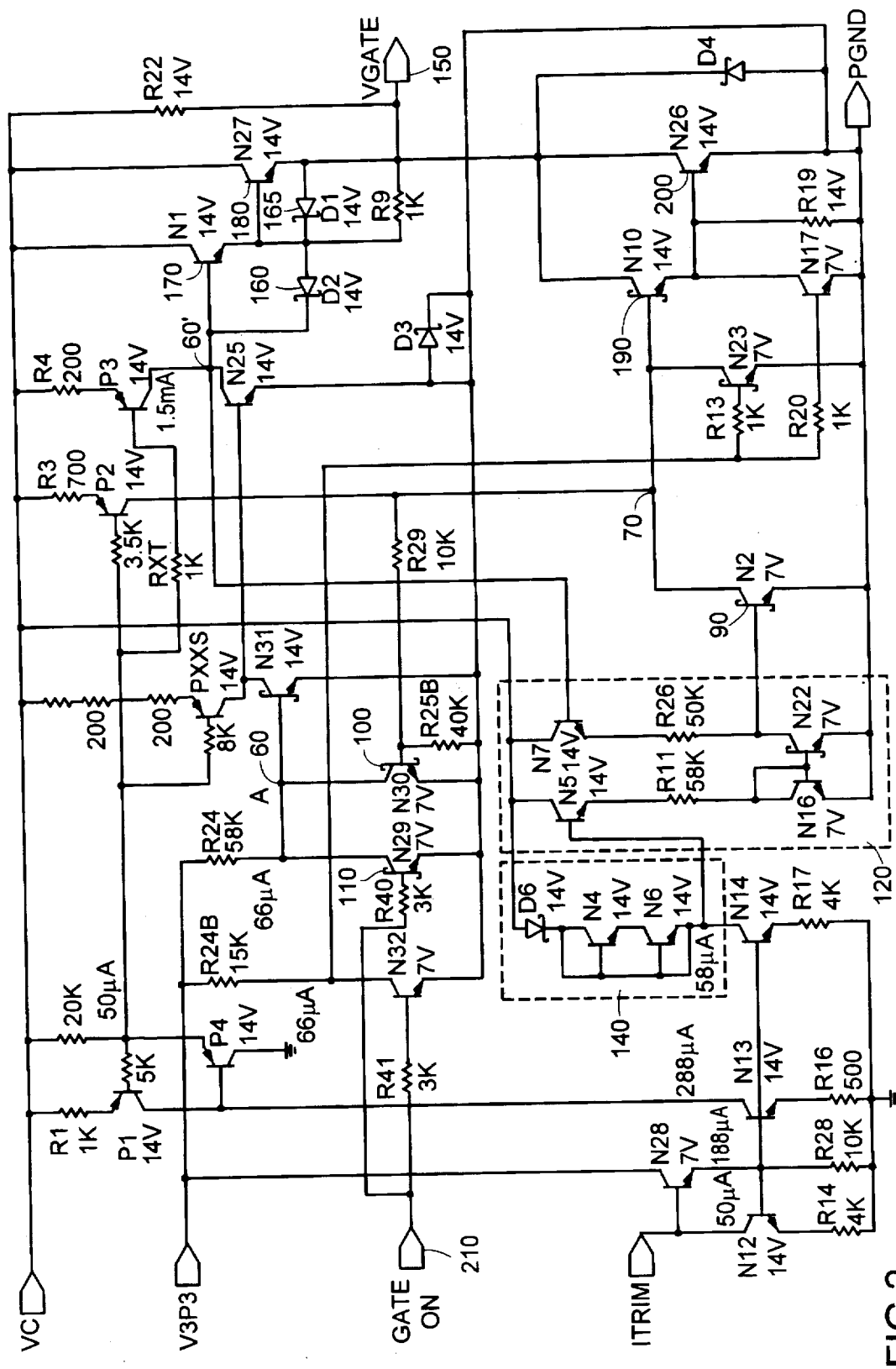
FIG. 2 is a circuit diagram of an embodiment of the present invention.

A more detailed circuit diagram illustrating an embodiment of the present invention is given in FIG. 2. Some of the components in FIG. 2 are identified with the same numerals as corresponding components in FIG. 1. The collectors of transistors 100 and 110 are coupled to node 60' via a buffer comprising transistors N31 and N25. Transistors N28, N12, N13, and N14 form part of a current mirror for biasing the $V_{BE}$ circuit 140 comprising diode D6 and transistors N4 and N6, and also for biasing another current mirror comprising transistors P1, P2, and P3. $V_{BE}$ circuit 140 has fusible links so that transistors N4 and N6 can be effectively placed in the circuit. Schottky diode D4 prevents $V_G$ pin 150 from being pulled too low. That is, due to an inductance effect of an external circuit (not shown) connected to pin 150, the voltage at pin 150 can be pulled too low when the rate of change of voltage is large. With Schottky diode D4, the voltage at pin 150 is kept from falling below one Schottky diode voltage drop from ground, thereby preventing the parasitic diode comprising the epitaxial layer and substrate of npn transistor 200 from being forward biased.

Terminals 40 and 50 of FIG. 1 are replaced by terminal 210 of FIG. 2. Only one digital input signal is needed for switching, in which the digital input signal is applied to transistor 110 and the collector of transistor N32 provides the complementary digital signal.

Transistors N23 and N17 perform the switching function of transistor 80 of FIG. 1. Diodes 160 and 165 are Zener clamping diodes designed to protect the base-emitter junctions of transistors 170 and 180. Resistor R9 increases the breakdown voltage of transistor 180.

What is claimed is:

1. A circuit, having a first node with a first node voltage and a second node with a second node voltage, for switching the first and second node voltages between HIGH and LOW so as to exclude a state in which both first and second node voltages are HIGH, the circuit comprising:

a first switching element coupled to the first node and having an input to switch the first switching element ON and OFF to provide a conducting path from the first node to ground when the first switching element is ON;

a second switching element coupled to the first node, having an input coupled to the second node and responsive to the second node voltage to switch the second switching element ON and OFF to provide a conducting path from the first node to ground when the second switching element is ON, the first and second switching elements in combination to bring the first node voltage to LOW in response to at least one of the first and second switching elements being ON;

a first current source coupled to the first node to bring the first node voltage to HIGH in response to the first and second switching elements being OFF;

a third switching element, coupled to the second node to provide a conducting path from the second node to ground when the third switching element is ON, having an input coupled to the first node to be responsive to the first node voltage so as to switch the third switching element OFF in response to the first node voltage being brought to LOW and to switch the third switching element ON in response to the first node voltage being brought to HIGH;

a fourth switching element coupled to the second node and having an input to switch the fourth switching element ON and OFF to provide a conducting path from the second node to ground when the fourth switching element is ON, the third and fourth switching elements in combination to bring the second node voltage LOW when at least one of the third and fourth switching elements is ON; and a second current source coupled to the second node to bring the second node voltage to HIGH when the third and fourth switching elements are OFF, so that the first, second, third, and fourth switching elements switch the first and second node voltages between HIGH and LOW so as to exclude a state in which both first and second node voltages are HIGH.

2. The circuit as set forth in claim 1, wherein:

in applying, in synchronism, a first signal to the input of the first switching element to switch the first switching element ON and a second signal to the input of the fourth switching element to switch the fourth switching element OFF when the circuit is initially in a first state characterized by: the first and second switching elements being OFF, the third and fourth switching elements being ON, the first node voltage at HIGH, and the second node voltage at LOW; the first switching element switches from OFF to ON before the third switching element switches from ON to OFF and the first node voltage is brought LOW before the second node voltage is brought HIGH; and in applying, in synchronism, a third signal to the input of the first switching element to switch the first switching element OFF and a fourth signal to the input of the fourth switching element to switch the fourth switching element ON when the circuit is initially in a second state characterized by: the first and second switching elements being ON, the third and fourth switching elements being OFF, the first node voltage at LOW, and the second node voltage at HIGH; the second switching element switches from ON to OFF after the third switching element switches from OFF to ON and the second node voltage is brought LOW before the first node voltage is brought HIGH.

3. The circuit as set forth in claim 1, further comprising:

a comparator circuit having a first input coupled to the second node and responsive to the second node voltage, a second input with a voltage, and an output with an output voltage; and a $V_{BE}$ circuit to provide the voltage at the second input of the comparator circuit; wherein the second switching element is coupled to the output of the comparator circuit and is responsive to the output voltage of the comparator circuit so as to provide a conducting path from the first node to ground when the output voltage of the comparator circuit is HIGH.

4. The circuit as set forth in claim 1, further comprising:

an output node; and a totem pole output circuit, including:

an active pulldown circuit coupled to the first node to provide at the output node a conducting path to ground in response to the first node voltage being brought HIGH and to provide at the output node a high impedance path to ground in response to the first node voltage being brought LOW; and an active pullup circuit coupled to the second node to provide at the output node a conducting path to a voltage supply source in response to the second node voltage being brought HIGH and to provide at the output node a high impedance path to the voltage supply source in response to the second node voltage being brought LOW.

5. The circuit as set forth in claim 4, further comprising:

a comparator circuit having a first input coupled to the second node and responsive to the second node voltage, a second input with a voltage, and an output with an output voltage; and a $V_{BE}$ circuit to provide the voltage at the second input of the comparator circuit; wherein the second switching element is coupled to the output of the comparator circuit and is responsive to the output voltage of the comparator circuit so as to provide a conducting path from the first node to ground when the output voltage of the comparator circuit is HIGH.

6. The circuit as set forth in claim 5, wherein the pullup circuit comprises:

first and second transistors configured as a Darlington pair, each having a base and emitter;

a first diode coupling the base of the first transistor to its emitter, the first diode having a forward voltage drop, to clamp the emitter-base voltage of the first transistor at the forward voltage drop of the first diode;

a second diode coupling the base of the second transistor to its emitter, the second diode having a forward voltage drop, to clamp the emitter-base voltage of the second transistor at the forward voltage drop of the second diode; and wherein the $V_{BE}$ circuit provides a voltage drop greater than the sum of the forward voltage drops of the first and second diodes.

7. A driver circuit, having an output node, for charging and discharging the gate of a field effect transistor (FET) coupled to the output node, the driver circuit comprising:

first switching means, having an input to switch the first switching means ON and OFF and having an output, for providing at its output a first conducting path to ground when the first switching means is ON and a first high impedance path to ground when the first switching means is OFF;

second switching means, having an input to switch the second switching means ON and OFF and having an output, for providing at its output a second conducting path to ground when the second switching means is ON and a second high impedance path to ground when the second switching means is OFF; wherein the outputs of the first and second switching means are coupled to a first node having a first node voltage such that the first node voltage is brought LOW in response to at least one of the first and second switching means switching ON;

third switching means, having an input to switch the third switching means ON and OFF and having an output, for providing at its output a third conducting path to ground when the third switching means is ON and a third high impedance path to ground when the third switching means is OFF;

fourth switching means, having an input to switch the fourth switching means ON and OFF and having an output, for providing at its output a fourth conducting path to ground when the fourth switching means is ON and a fourth high impedance path to ground when the fourth switching means is OFF; wherein the outputs of the third and fourth switching means are coupled to a second node having a second node voltage such that the second node voltage is brought LOW in response to at least one of the third and fourth switching means switching ON;

wherein the first node is coupled to the input of the third switching means so that the third switching means is responsive to the first node voltage and switches OFF in response to the first node voltage going LOW and switches ON in response to the first node voltage going HIGH;

wherein the second node is coupled to the input of the second switching mean so that the second switching means is responsive to the second node voltage and switches OFF in response to the second node voltage going LOW and switches ON in response to the second node voltage going HIGH;

a pulldown circuit, coupled to the output node and the first node and responsive to the first node voltage, to discharge the gate of the FET coupled to the output node in response to the first node voltage going HIGH; and a pullup circuit, coupled to the output node and the second node and responsive to the second node voltage, to charge the gate of the FET coupled to the output node in response to the second node voltage going HIGH.

8. The driver circuit as set forth in claim 7, wherein:

in applying, in synchronism, a first signal to the input of the first switching means to switch the first switching means ON and a second signal to the input of the fourth switching means to switch the fourth switching means OFF when the driver circuit is initially in a first state characterized by: the first and second switching means being OFF, the third and fourth switching means being ON, the first node voltage at HIGH, and the second node voltage at LOW; the first switching means switches from OFF to ON before the third switching means switches from ON to OFF and the first node voltage is brought LOW before the second node voltage is brought HIGH; and in applying, in synchronism, a third signal to the input of the first switching means to switch the first switching means OFF and a fourth signal to the input of the fourth switching means to switch the fourth switching means ON when the driver circuit is initially in a second state characterized by: the first and second switching means being ON, the third and fourth switching means being OFF, the first node voltage at LOW, and the second node voltage at HIGH; the second switching means switches from ON to OFF after the third switching means switches from OFF to ON and the second node voltage is brought LOW before the first node voltage is brought HIGH.

9. The driver circuit as set forth in either claim 7 or claim 8, further comprising:

first current means, coupled to the first node, for bringing the first node from a LOW voltage to a HIGH voltage when both first and second switching elements are switched OFF and to provide bias current to the pulldown means; and second current means, coupled to the second node, to bring the second node from a LOW voltage to a HIGH voltage when both third and fourth switching elements are switched OFF and to provide bias current to the pullup means.

10. The driver circuit as set forth in claim 9, wherein the second switching means comprises:

a comparator circuit having a first input coupled to the second node, a second input with a voltage, and an output with an output voltage;

a $V_{BE}$ circuit to provide the voltage at the second input of the comparator circuit; and fifth switching means responsive to the output voltage of the comparator circuit for providing a conducting path from the first node to ground when the output voltage of the comparator circuit is HIGH.

11. The driver circuit as set forth in claim 10, wherein the third and fourth switching means comprise first and second transistors having their emitters connected to each other and their collectors connected to each other.

12. The driver circuit as set forth in claim 11, wherein:

the pullup means comprises third and fourth transistors configured as a first Darlington pair, the third transistor having a base with a voltage;

the pulldown means comprises fifth and sixth transistors configured as a second Darlington pair; and the driver circuit further comprises a buffer circuit coupling the collectors of the first and second transistors to the pullup means so as to decouple the capacitance of the collectors of the first and second transistors from the base of the third transistor and so that the voltage at the base of the third transistor is responsive to the voltage at the collectors of the first and second transistors.

13. The driver circuit as set forth in claim 12, further comprising:

a first diode coupling the base of the third transistor to its emitter to prevent emitter-base junction breakdown of the third transistor, the first diode having a forward voltage drop;

a second diode coupling the base of the fourth transistor to its emitter to prevent emitter-base junction breakdown of the fourth transistor; and wherein the $V_{BE}$ circuit provides a voltage drop greater than the sum of the forward voltage drops of the first and second diodes.

14. The driver circuit as set forth in claim 13, further comprising:

a FET having a gate coupled to the output node, the gate having a gate voltage, wherein the buffer circuit provides for a rate of change of the voltage at the base of the third transistor greater than the rate of change of the gate voltage when the gate of the FET is initially discharging.

15. A driver circuit, having a totem pole output circuit, for charging and discharging a capacitive load without cross-conduction in the totem pole output circuit, the driver circuit comprising:

a first switching element coupled to a first node and having an input to switch the first switching element ON and OFF to provide a conducting path from the first node to ground when the first switching element is ON, the first switching element having a first switching delay, the first node having a first node voltage;

a second switching element coupled to the first node, having an input coupled to a second node with a second node voltage and responsive to the second node voltage to switch the second switching element ON and OFF to provide a conducting path from the first node to ground when the second switching element is ON, the first and second switching elements in combination to bring the first node voltage to LOW in response to at least one of the first and second switching elements being ON, the second switching element having a second switching delay;

a first current source coupled to the first node to bring the first node voltage to HIGH in response to the first and second switching elements being OFF;

a third switching element, coupled to the second node to provide a conducting path from the second node to ground when the third switching element is ON, having an input coupled to the first node to be responsive to the first node voltage so as to switch the third switching element OFF in response to the first node voltage being brought to LOW and to switch the third switching element ON in response to the first node voltage being brought to HIGH, the third switching element having a third switching delay;

a fourth switching element coupled to the second node and having an input to switch the fourth switching element ON and OFF to provide a conducting path from the second node to ground when the fourth switching element is ON, the third and fourth switching elements in combination to bring the second node voltage LOW when at least one of the third and fourth switching elements is ON, the fourth switching element having a fourth switching delay;

a second current source coupled to the second node to bring the second node voltage to HIGH when the third and fourth switching elements are OFF;

a comparator circuit having a first input coupled to the second node and responsive to the second node voltage, a second input with a voltage, and an output with an output voltage, the comparator circuit having a fifth switching delay, wherein the second switching element is coupled to the output of the comparator circuit and is responsive to the output voltage of the comparator circuit so as to provide a conducting path from the first node to ground when the output voltage of the comparator circuit is HIGH;

a $V_{BE}$ circuit to provide the voltage at the second input of the comparator circuit;

an output node; and a totem pole output circuit, including:

an active pulldown circuit coupled to the first node to provide at the output node a conducting path to ground in response to the first node voltage being brought HIGH and to provide at the output node a high impedance path to ground in response to the first node voltage being brought LOW; and an active pullup circuit coupled to the second node to provide at the output node a conducting path to a voltage supply source in response to the second node voltage being brought HIGH and to provide at the output node a high impedance path to the voltage supply source in response to the second node voltage being brought LOW;

wherein the first, second, third, fourth, and fifth switching delays are such that the driver circuit charges and discharges a capacitive load when coupled to the output node without cross-conduction in the totem pole output circuit.

16. The driver circuit as set forth in claim 15, wherein:

the third and fourth switching elements comprise first and second transistors having their emitters connected to each other and their collectors connected to each other;

the pullup means comprises third and fourth transistors configured as a first Darlington pair, the third transistor having a base with a voltage;

the pulldown means comprises fifth and sixth transistors configured as a second Darlington pair; and the driver circuit further comprises a buffer circuit coupling the collectors of the first and second transistors to the pullup means so as to decouple the capacitance of the collectors of the first and second transistors from the base of the third transistor and so that the voltage at the base of the third transistor is responsive to the voltage at the collectors of the first and second transistors.

17. The driver circuit as set forth in claim 16, further comprising:

a first diode coupling the base of the third transistor to its emitter to prevent emitter-base junction breakdown of the third transistor, the first diode having a forward voltage drop; and a second diode coupling the base of the fourth transistor to its emitter to prevent emitter-base junction breakdown of the fourth transistor, wherein the $V_{BE}$ circuit provides a voltage drop greater than the sum of the forward voltage drops of the first and second diodes.

18. The driver circuit as set forth in claim 17, further comprising:

a FET having a gate coupled to the output node, the gate having a gate voltage, wherein the buffer circuit provides for a rate of change of the voltage at the base of the third transistor greater than the rate of change of the gate voltage when the gate of the FET is initially discharging.

* * * * *